United States Patent
Sung

(10) Patent No.: US 7,442,617 B2
(45) Date of Patent: Oct. 28, 2008

(54) METHOD FOR MANUFACTURING BIPOLAR TRANSISTOR

(75) Inventor: Woong Je Sung, Bucheon-si (KR)

(73) Assignee: Dongbu Electronics Co., Ltd., Seoul (KR)

( * ) Notice: Subject to any disclaimer, the term of this patent is extended or adjusted under 35 U.S.C. 154(b) by 0 days.

(21) Appl. No.: 12/001,226

(22) Filed: Dec. 10, 2007

(65) Prior Publication Data

US 2008/0102592 A1 May 1, 2008

Related U.S. Application Data

(62) Division of application No. 11/644,648, filed on Dec. 22, 2006, now Pat. No. 7,329,584.

(30) Foreign Application Priority Data

Dec. 28, 2005 (KR) .............. 10-2005-0132656
Dec. 28, 2005 (KR) .............. 10-2005-0132657

(51) Int. Cl.
*H01L 21/331* (2006.01)
*H01L 21/8222* (2006.01)

(52) U.S. Cl. .............. 438/309; 438/322; 438/327; 257/E21.608

(58) Field of Classification Search ......... 438/203–205, 438/234, 236, 309, 313, 322, 325–327; 257/E21.35, 257/E21.608, E21.695
See application file for complete search history.

(56) References Cited

U.S. PATENT DOCUMENTS

| 5,665,615 A * | 9/1997 | Anmo .................. 438/202 |
| 6,177,325 B1 | 1/2001 | Jang |
| 7,088,168 B2 | 8/2006 | Lee et al. |

* cited by examiner

*Primary Examiner*—Hoai V Pham
(74) *Attorney, Agent, or Firm*—Andrew D. Fortney

(57) ABSTRACT

A method for manufacturing a bipolar transistor comprising: forming a device isolation layer in a device isolation region of a semiconductor substrate having therein first and second well regions having a first conductivity; implanting ions of a second conductivity in the first well to form a third well; forming and patterning a conductive layer on the third well region to form a base electrode pattern; forming a spacer on a sidewalls of the base electrode pattern; implanting first conductivity type ions in the semiconductor substrate to form an emitter region adjacent to the base electrode pattern and form a collector region in the second well region; and performing a diffusion process to form a base region adjacent to the emitter region.

12 Claims, 5 Drawing Sheets

METHOD FOR MANUFACTURING BIPOLAR TRANSISTOR

The present application is a divisional of U.S. patent application Ser. No. 11/644,648, filed Dec. 22, 2006, now U.S. Pat. No. 7,239,584.

BACKGROUND OF THE INVENTION

1. Field of the Invention

The present invention relates to a method for manufacturing a bipolar transistor.

2. Description of the Related Art

Recent demand for a high speed signal processing device has rapidly increased. To meet such a demand, a bipolar transistor for high speed signal processing has been developed. The bipolar transistor may reduce a base resistance by reducing a distance between a base region and an emitter region.

Figure 1:
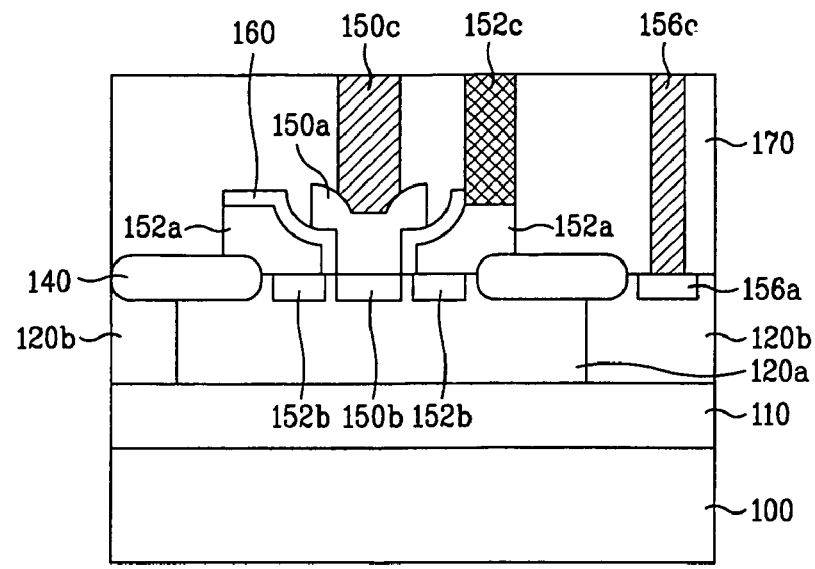

FIG. 1 is a cross-sectional view showing a construction of a high speed bipolar transistor according to the related art.

As shown in FIG. 1, a buried layer 110 is formed on a substrate 10, and a device isolation layer 140 is formed on the buried layer 110. Here, the device isolation layer 140 is divided into a first well 120a and a second well 120b. A first active region is formed at the first well 120a and a second active region is formed at the second well 120b. An emitter region 150b and a base region 152b are formed inside the first active region of the first well 120a. A collector region 156a is formed inside the second active region of the second well 120b. An emitter electrode 150a is formed at the emitter region 150 to be connected to the first contact plug 150c. A collector region 156a is connected to a second contact plug 156c. A base electrode 152a is formed at the base region 152b to be connected to a third contact plug 152c. A pad oxide layer 160 is formed between the base electrode 152a and the emitter electrode 150a. The first, second, and third contact plugs 150c, 156c, and 152c are connected to the emitter region 150b, the collector region 156a, and the base region 152b through the inter layer dielectric 170, respectively.

On the other hand, in the bipolar transistor formed as mentioned above, the pad oxide layer 160 isolates the emitter electrode 150a and the base electrode 152a. Ions doped in the emitter electrode 150a are diffused to form the emitter region 150b, and ions doped into the base electrode 152a are diffused to form the base region 152b.

However, when forming the aforementioned bipolar transistor, a height of the interlayer dielectric 170 including the emitter electrode 150a and the base electrode 152a may be relatively great in order to secure a CMP process margin during formation of the contact plugs to the electrodes. As a result, it becomes difficult to more highly integrate a device.

Moreover, two polysilicon layer formation and etching processes are performed to form the emitter electrode 150a and the base electrode 152a, respectively. Thus, it may be difficult to simplify a process. During an etching process for forming the contact plugs, an overetching loss of the polysilicon layer constituting the electrodes can be incurred.

SUMMARY OF THE INVENTION

Accordingly, the present invention is directed to a method for manufacturing a bipolar transistor that substantially obviates one or more problems due to limitations and disadvantages of the related art.

Accordingly, an object of the present invention is to provide a bipolar transistor.

Additional advantages, objects, and features of the invention will be set forth in part in the description which follows and in part will become apparent to those skilled in the art upon examination of the following or may be learned from practice of the invention. The objectives and other advantages of the invention may be realized and attained by the structure (s) particularly pointed out in the written description and claims hereof as well as the appended drawings.

To achieve these objects and other advantages, and in accordance with the purpose of the invention, as embodied and broadly described herein, there is provided a method for manufacturing a bipolar transistor comprising: forming a device isolation layer in a device isolation region of a semiconductor substrate having first and second well regions having a first conductivity; implanting ions having a second conductivity in the first well to form a third well; forming and patterning a conductive layer on the semiconductor substrate to form an emitter electrode pattern on the third well region and a collector electrode pattern on the second well region; forming spacers at sidewalls of the emitter electrode pattern and the collector electrode pattern; performing a diffusion process to form an emitter region having a first conductivity in the third well region and to form a collector region having a first conductivity on the second well region; implanting ions having a second conductivity in the third well region to form a base region; and removing the emitter electrode pattern and the collector region pattern.

In another aspect of the present invention, there is provided a method for manufacturing a bipolar transistor comprising: forming a device isolation layer in a device isolation region of a semiconductor substrate having first and second well regions having a first conductivity therein; implanting ions having a second conductivity in the first well to form a third well; forming and patterning a conductive layer on the semiconductor substrate to form a base electrode pattern; forming a spacer at sidewalls of the base electrode pattern; implanting ions having a first conductivity in the semiconductor substrate to form an emitter region between base electrode pattern structures and form a collector region in the second well region; and performing a diffusion process on the semiconductor substrate to form base region(s) between the emitter region.

It is to be understood that both the foregoing general description and the following detailed description of the present invention are exemplary and explanatory and are intended to provide further explanation of the invention as claimed.

BRIEF DESCRIPTION OF TEE DRAWINGS

The accompanying drawings, which are included to provide a further understanding of the invention and are incorporated in and constitute a part of this application, illustrate embodiment(s) of the invention and together with the description serve to explain the principle(s) of the invention. In the drawings:

FIG. 1 is a cross-sectional view showing a construction of a high speed bipolar transistor according to the related art;

FIGS. 2 through 6 are cross-sectional views of a bipolar transistor for sequentially describing a method for manufacturing the bipolar transistor according to a first embodiment of the present invention; and FIGS. 7 through 12 are cross-sectional views of a bipolar transistor for sequentially describing a method for manufacturing the bipolar transistor according to a second embodiment of the present invention.

DETAILED DESCRIPTION OF THE INVENTION

Reference will now be made in detail to the preferred embodiments of the present invention, examples of which are illustrated in the accompanying drawings. Wherever possible, the same reference numbers will be used throughout the drawings to refer to the same or like parts.

Hereinafter, the method for manufacturing the bipolar transistor according to the present invention with reference to the accompanying drawings in detail.

FIGS. 2 through 6 are cross-sectional views of a bipolar transistor for sequentially describing a method for manufacturing the bipolar transistor according to a first embodiment of the present invention.

Figure 2:
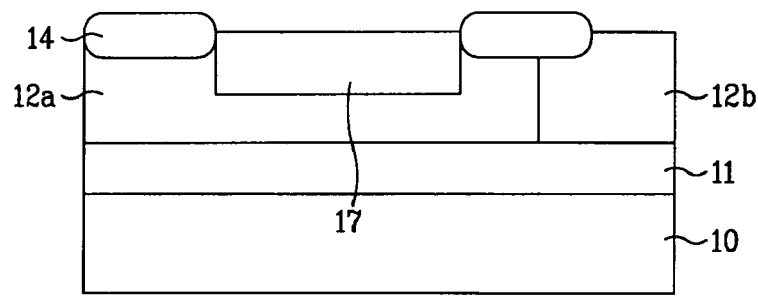

First, as shown in FIG. 2, a substrate 10, for example, a p-type (first conductivity) silicon substrate is prepared and/or provided. Here, an n-type (second conductivity, opposite or complementary to the first conductivity) buried layer 11 is on the substrate 10, typically by epitaxial growth of silicon or a silicon-germanium alloy. A first well 12a and a second well 12b doped with n-type (second conductivity) ions are formed in the buried layer 11, typically by ion implantation.

Next, for a device isolation of the bipolar transistor, a device isolation layer 14 can be formed in a field region of the substrate 10. Typically, the device isolation layer 14 can be formed by conventional local oxidation of silicon or shallow trench isolation.

The device isolation layer 14 (which is formed in a field region of the substrate 10) functions to divide an active region of the substrate 10 into a first active region for an emitter region and a base region, and second active region for a collector region.

Then, a photolithography process and an ion implantation process are performed on the substrate on which the device isolation layer 14 is formed in order to form a third well 17 of a p-type in the first well 12a of the first active region. Here, a base and an emitter will be formed in the first well 12a.

Figure 3:
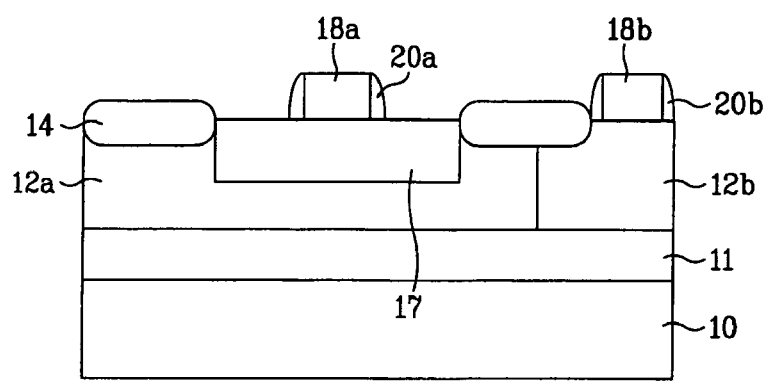

Thereafter, as shown in FIG. 3, a polysilicon layer doped with n-type ions is formed on the resulting object on which the third well 17 is formed, and a photoresist pattern (not shown) for defining an emitter electrode pattern and a collector electrode pattern are formed on the polysilicon layer. The poly silicon layer is etched using the photoresist pattern as an etch mask to form an emitter electrode pattern 18a on the third well 17 and a collector electrode pattern 18b on the second well 12b.

After forming the emitter electrode pattern 18a and the collector electrode pattern 18b, a process is executed for patterning a photoresist which is used for ion implantation. In detail, after patterning the photoresist, n+ ions are implanted in the emitter electrode pattern 18a and the collector electrode pattern 18b using the photoresist as a mask. Alternatively, a doped polysilicon layer (or other patternable source of diffusible dopant atoms) may be deposited directly (e.g., by chemical vapor deposition of silicon from a silane and a dopant source such as diborane, BF3, phosphine, etc.), then patterned, without need for the ion implantation step described in this paragraph.

Subsequently, a nitride layer is formed on the resulting object on which the emitter electrode pattern 18a and the collector electrode pattern 18b are formed. Further, an etching process such as a blanket etch is carried out to form spacers 20a and 20b at sidewalls of the emitter electrode pattern 20a and the collector electrode pattern 20b.

Figure 4:
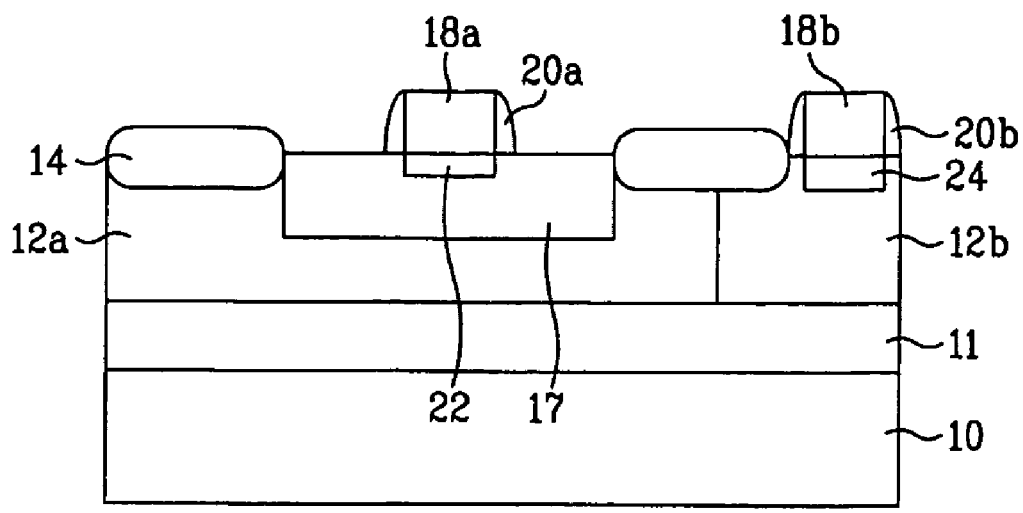

Next, as shown in FIG. 4, a diffusion process is performed on the resulting object on which the spacers 20a and 20b are formed, so that n-type ions doped in the emitter electrode pattern 18a and the collector electrode pattern 18b are diffused to form an emitter region 22 and a collector region 24.

Figure 5:
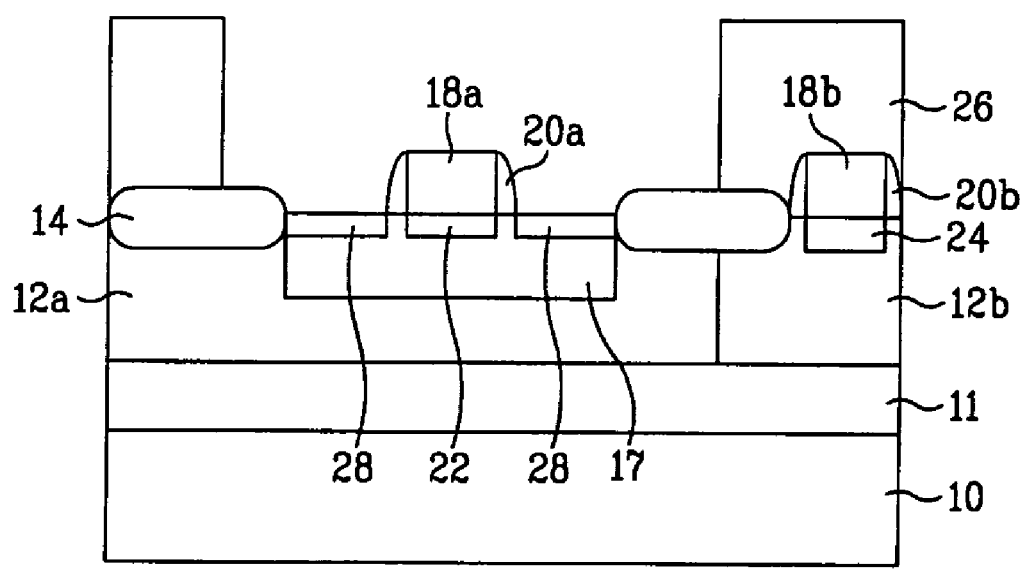

Then, as shown in FIG. 5, a photoresist pattern 26 for defining a base region is formed on the resulting object. Next, p-type ions are implanted using the photoresist pattern 26 as a mask to form a base region 28 inside the third well 17.

The base region 28 is spaced apart from the diffused emitter region 22 due to the spacer 20a.

Figure 6:
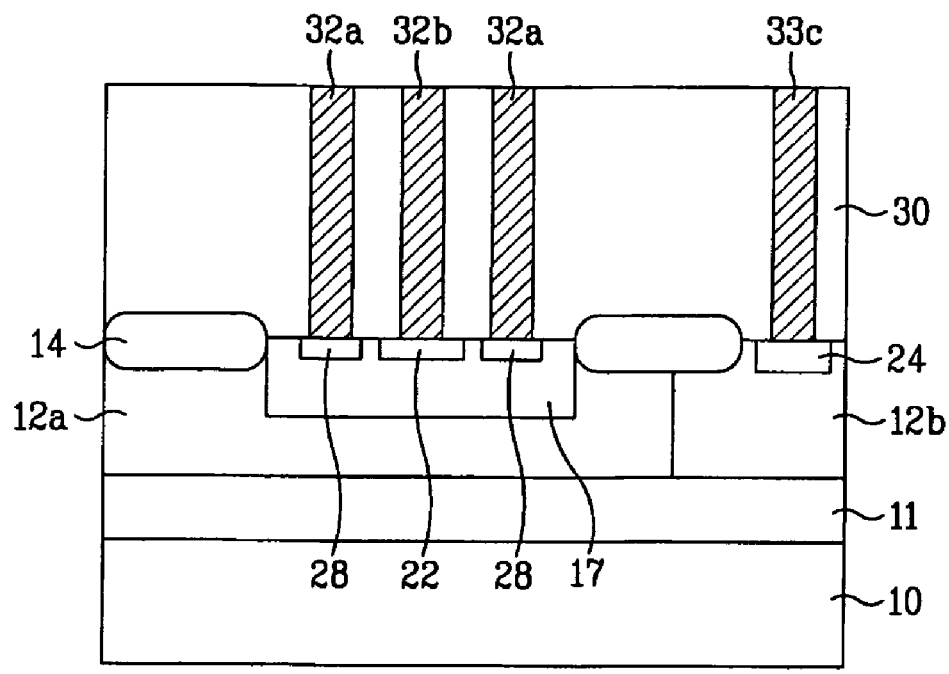

Finally, as shown in FIG. 6, the spacers 20a and 20b, the emitter electrode pattern 22, and the base electrode pattern 28 are respectively removed. A dielectric 30 (which may be referred to as an interlayer dielectric) is formed on an entire surface of the substrate from which the emitter electrode pattern 22 and the base electrode pattern 28 have been removed. Further, a photoresist pattern (not shown) is formed on the dielectric 27. An etch process is performed using the photoresist pattern us a mask to form a plurality of contact holes, respectively exposing the base region 28, the emitter region 22, and the collector region 24.

After a conductive layer has been formed or otherwise deposited in the contact hole, a planarization process is carried out until the dielectric 30 is exposed, in order to form contact plugs 32a, 32b, and 32c contacting with the base region 28, the emitter region 22, and the collector region 24, respectively. The contact plugs may comprise a metal such as tungsten (W) or copper (Cu) and may further comprise an adhesive liner on the sidewall of the contact holes, such as Ti or Ta, and/or a barrier layer between the metal and the contact hole sidewalls, such as TiN or TaN. Accordingly, the process is terminated.

On the other hand, after a polysilicon layer doped with n-type ions has been formed, the n-type ions are diffused to form an emitter region 22 and a collector region 24. Next, by the emitter electrode pattern 18a and the spacer 20a, a self-aligned base region 28 is formed. The spacer 20a secures a distance between the base region 28 and the emitter region 22 that allows a resistance of the base region to be reduced.

Furthermore, after the emitter electrode pattern 18a and the collector electrode pattern 18b have been formed, they are removed. Accordingly, in order to secure a CMP process margin required during a formation process of the contact plug, the dielectric layer can have a relatively small thickness which leads to or enables increased integration of a device. For example, the dielectric layer 30 may have a thickness of from 2500, 3000 or 4000 Å to 5000, 6000 or 7000 Å.

In addition, after the emitter electrode pattern 18a and the collector electrode pattern 18b have been formed, they are removed. Accordingly, a process may be simplified. Moreover, during an etch process for forming the contact plug, it can completely prevent a loss of the polysilicon layer.

In the first embodiment of the present invention, after a polysilicon layer doped with n-type ions has been formed, the n-type ions are diffused to form an emitter region and a collector region. Next, through the emitter electrode pattern 18a and the spacers, the self-aligned base region is formed. Accordingly, the spacers secure a distance between the base region and the emitter region that allows a resistance of the base region to be reduced.

Furthermore, after the emitter electrode pattern and the collector electrode pattern have been formed, they are removed. Accordingly, in order to secure a CMP process margin required during a formation process of the contact plug, the inter layer dielectric can be thinly formed which leads to an integration of a device.

In addition, after the emitter electrode pattern and the collector electrode pattern have been formed, they are removed. Accordingly, a process may be simplified. Moreover, during an etch process for forming the contact plug, it can prevent any loss of the polysilicon layer.

FIGS. 7 through 12 are cross-sectional views of a bipolar transistor for sequentially describing a method for manufacturing the bipolar transistor according to a second embodiment of the present invention.

Figure 7:
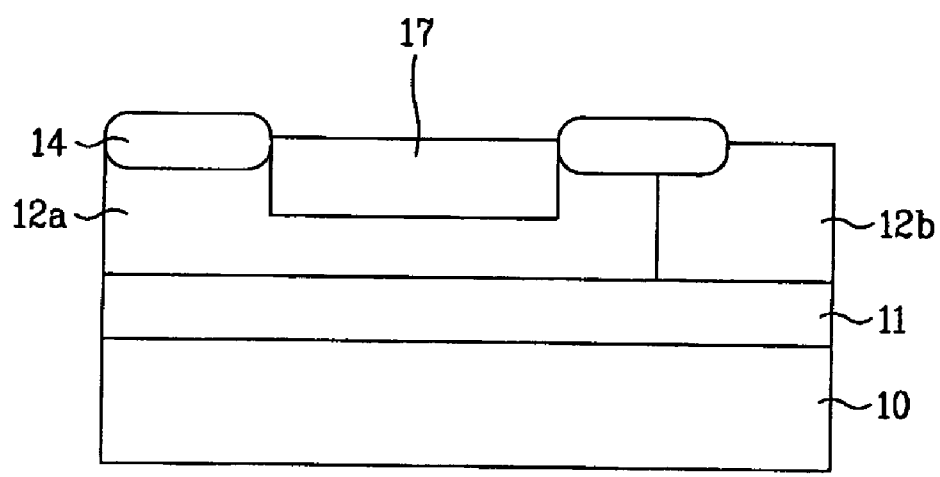

First, as shown in FIG. 7, a substrate 10 (e.g., a p-type silicon substrate) is prepared and/or provided. Here, an n-type buried layer 11 is formed on the substrate 10, as described above. A first well 12a and a second well 12b doped with n-type ions are formed in the buried layer 11, as described above.

Next, a device isolation layer 14 for the bipolar transistor is formed in a field region of the substrate 10.

As described above, the device isolation layer 14 functions to divide an active region of the substrate 10 into a first active region for an emitter region and a base region, and second active region for a collector region.

Then, a photolithography process and an ion implantation process are performed on the substrate on which the device isolation layer 14 is formed in order to form a third well 17 of a p-type in the first well 12a of the first active region. Here, a base region and an emitter will be formed in the first well 12a.

Figure 8:
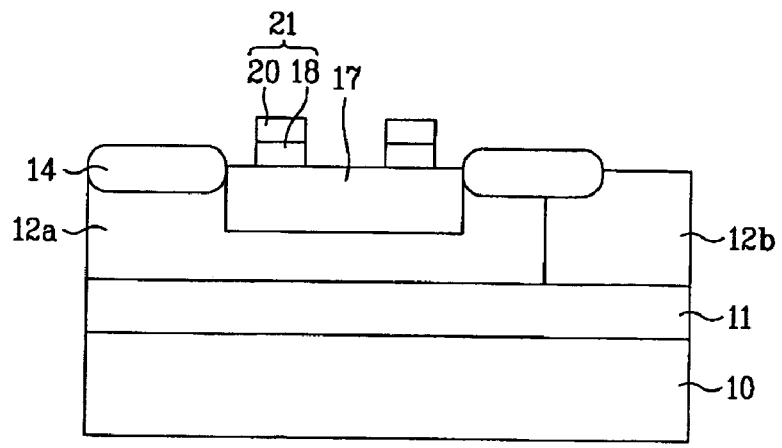

Thereafter, as shown in FIG. 8, a p-type doped polysilicon layer 18 and an oxide layer 20 are formed on the resulting object on which the third well 17 is formed, and a photoresist pattern (not shown) for defining a base electrode pattern is formed on the oxide layer. The oxide layer 20 and the polysilicon layer 18 are etched using the photoresist pattern as an etch mask to form a base electrode pattern 21 (which comprises at least two parallel portions spaced apart from each other) on the third well 17.

Figure 9:
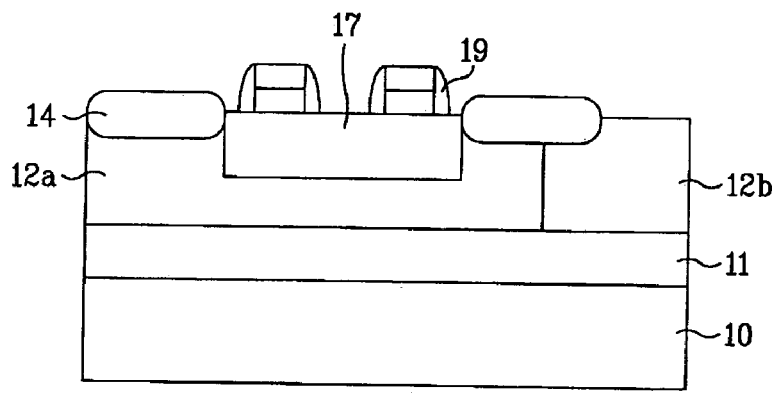

Subsequently, as shown in FIG. 9, after a nitride layer has been deposited on the resulting object on which the base electrode pattern 21 is formed, an etching process such as an etch back (or anisotropic etch process) is carried out to form spacers 19 at sidewalls of the base electrode pattern 21.

Figure 10:
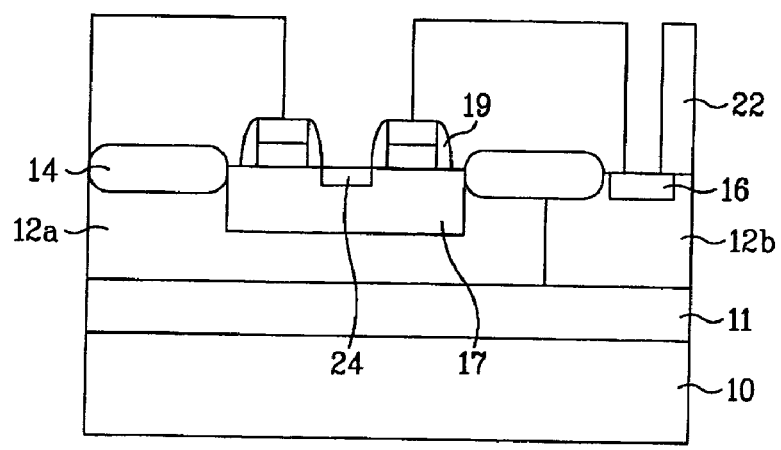

As shown in FIG. 10, a photo resist pattern 22 is formed on the resulting object on which the base electrode pattern 21 is formed. Here, the spacer 19 is formed at the base electrode pattern 21. Further, the photoresist pattern 22 functions to expose the third well 17 between the two parallel base electrode pattern portions 21 and the second well 12b of the second active region in which a collector region will be defined. Next, ions are implanted therein using the photoresist pattern 22 as a mask to form an emitter region 24 inside the third well 17 and a collector region 16 inside the second well 12b.

The photoresist pattern 22 and the base electrode pattern in which the spacer is formed are used as a self-align ion implantation mask during an ion implantation process for forming the emitter region 24.

Figure 11:
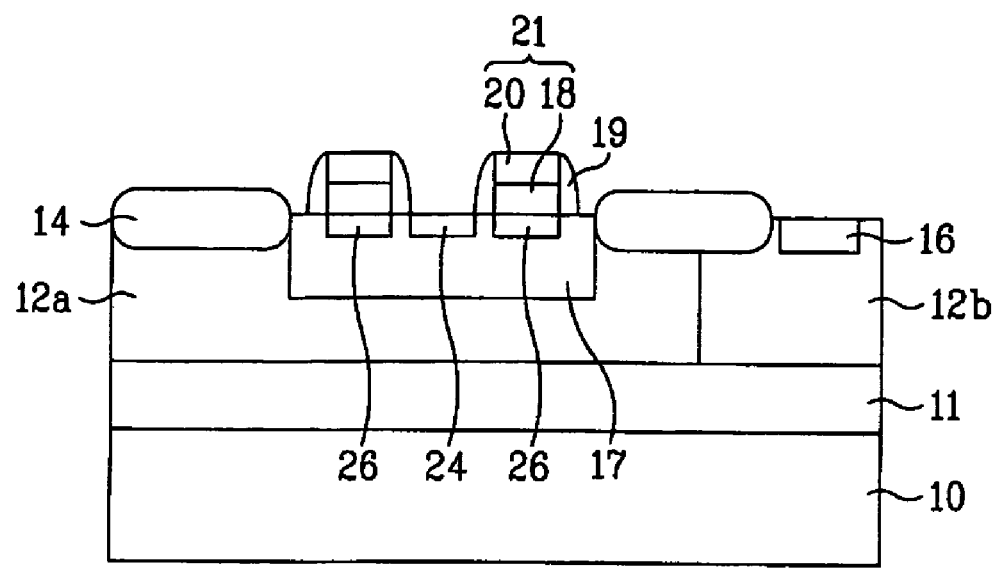

Then, as shown in FIG. 11, a diffusion process is performed on the resulting object in which the emitter region 24 and the collector region 16 are formed by diffusion of p-type ions doped in the polysilicon layer 18 of the base electrode pattern 21, so that a base region is formed. Moreover, the diffusion process diffuses and/or activates the n-type ions in the emitter region to form an emitter 24 having a similar depth to that of the base region 26.

The diffusion process can form the emitter region 24 and the base region 26 to have a similar depth using a diffusion coefficient difference of the p-type ions doped in the poly silicon layer 18 of the base electrode pattern and the n-type ions defined in the emitter region 24.

Figure 12:
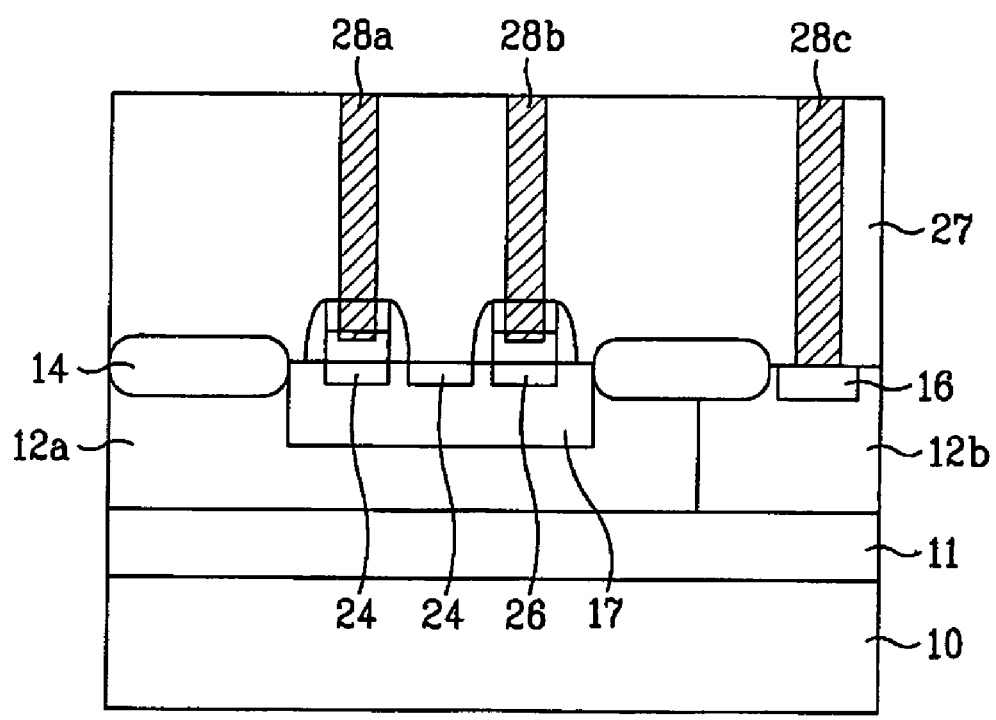

Finally, as shown in FIG. 12, a dielectric 27 is formed on an entire surface of the substrate in which the emitter region 24 and the base region 26 are defined. The dielectric 27 may comprise a silicon oxide (which may be undoped or doped with fluorine, boron and/or phosphorous, carbon, etc.). Further, a photoresist pattern (not shown) is formed on the dielectric 27. An etch process is performed using the photoresist pattern us a mask to form a contact hole exposing the polysilicon layer 18, the emitter region 24, and the collector region 16.

After a conductive layer has been formed in the contact hole as described above, a planarization process is carried out until the dielectric 27 is exposed, in order to form contact plugs 28a, 28b, and 28c in contact with the polysilicon layer 18 of the base electrode pattern, the emitter region 24, and the collector region 24, respectively.

On the other hand, after the polysilicon layer doped with p-type ions has been formed, the p-type ions are diffused to form the base region 26. Next, through the emitter electrode pattern 21 and the spacer 19, the self-aligned emitter region 24 is formed. The spacer 19 secures a distance between the base region 26 and the emitter region 24 that allows a resistance of the base region to be reduced.

Furthermore, in order to secure a CMP process margin during formation of the contact plug using the base electrode pattern 21, the interlayer dielectric can be thinly formed, which improves an integration of the device.

In addition, because the polysilicon layer may be patterned and etched to form only the emitter electrode, the process may be simplified. Moreover, since only the emitter electrode is formed from polysilicon or other patterned conductor, during an etch process for forming the contact plug, the loss of the polysilicon layer can be reduced in comparison with the case where the emitter electrode and the base electrode are formed from polysilicon.

In the second embodiment of the present invention, after the base electrode pattern has been formed of polysilicon layer doped with n-type ions, the n-type ions are diffused to form a base region. Next, through the base electrode pattern and the spacers, the self-aligned emitter region is formed. Accordingly, the spacers secure a distance between the base region 26 and the emitter region 24 that allows a resistance of the base region to be reduced.

So as to secure a CMP process margin during formation of the contact plug using only the base electrode pattern, the interlayer dielectric can be thinly formed which allows an integration of a device.

Because the polysilicon layer is patterned and etched to form only the emitter electrode, the process may be simplified. Moreover, since only the emitter electrode is formed, during an etch process for forming the contact plug, it can reduce the loss of the polysilicon layer constituting the electrodes in comparison with the case where the emitter electrode and the base electrode are formed.

It will be apparent to those skilled in the art that various modifications and variations can be made in the present invention. Thus, it is intended that the present invention covers the modifications and variations of this invention provided they come within the scope of the appended claims and their equivalents.

What is claimed is:

1. A method for manufacturing a bipolar transistor comprising:

forming a device isolation layer in a device isolation region of a semiconductor substrate having therein first and second well regions having a first conductivity;

implanting ions of a second conductivity in the first well to form a third well;

forming and patterning a conductive layer on the third well region to form a base electrode pattern;

forming a spacer on a sidewalls of the base electrode pattern;

implanting first conductivity type ions in the semiconductor substrate to form an emitter region adjacent to the base electrode pattern and form a collector region in the second well region; and performing a diffusion process to form a base region adjacent to the emitter region.

2. The method according to claim 1, further comprising forming and patterning a dielectric layer on an entire surface of the substrate after forming the base region;

forming a plurality of contact holes exposing the base electrode pattern, the emitter region, and the collector region; and forming a conductive layer in the contact holes to form contact plugs in contact with the emitter electrode, the base electrode pattern, and the collector region.

3. The method according to claim 1, wherein the conductive layer comprises a polysilicon layer containing a second conductivity type dopant.

4. The method according to claim 3, wherein the first conductivity is n-type, and the second conductivity is p-type.

5. The method according to claim 1, wherein the first conductivity is n-type, and the second conductivity is p-type.

6. The method according to claim 1, further comprising implanting n+ ions in the conductive layer.

7. The method according to claim 1, wherein the base electrode pattern comprises at least two parallel portions spaced apart from each other.

8. The method according to claim 1, wherein spacers secure a distance between the base region and the emitter region that allows a resistance of the base region to be reduced.

9. The method according to claim 1, wherein after the diffusion process, the base region has a depth similar to that of the emitter region.

10. The method according to claim 1, further comprising, after forming the base region, forming a dielectric layer on an entire surface of the substrate and patterning the dielectric layer.

11. The method according to claim 10, further comprising forming a plurality of contact holes in the dielectric layer exposing the base electrode pattern, the emitter region, and the collector region.

12. The method according to claim 11, further comprising forming contact plugs in the contact holes, the contact plugs being in contact with the emitter electrode, the base electrode pattern, and the collector region.

* * * * *